(12) United States Patent
Irie (10) Patent No.: US 6,548,827 B2
(45) Date of Patent: Apr. 15, 2003

(54) SEMICONDUCTOR APPARATUS WITH MISALIGNMENT MOUNTING DETECTION

(75) Inventor: Masaaki Irie, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/983,708

(22) Filed: Oct. 25, 2001

(65) Prior Publication Data

US 2002/0195706 A1 Dec. 26, 2002

(30) Foreign Application Priority Data

Jun. 25, 2001 (JP) ........................ 2001-191691

(51) Int. Cl.[7] ........................ H01L 23/58; H01L 23/544
(52) U.S. Cl. ........................ 257/48; 257/797; 438/18
(58) Field of Search ........................ 257/48, 797; 438/18

(56) References Cited

U.S. PATENT DOCUMENTS 4,994,735 A * 2/1991 Leedy ........................ 257/48
5,691,210 A * 11/1997 Mori et al. ........................ 438/127
6,392,251 B1 * 5/2002 McCarthy et al. ........................ 257/48

FOREIGN PATENT DOCUMENTS

| JP | 5-95030 | 6/1993 |
| JP | 10-335401 | 12/1998 |

* cited by examiner

*Primary Examiner*—Wael Fahmy
*Assistant Examiner*—Howard Weiss
(74) *Attorney, Agent, or Firm*—Leydig, Voit & Mayer, Ltd.

(57) ABSTRACT

A semiconductor apparatus includes a wiring substrate and a semiconductor device to be mounted at a proper mounting position on the wiring substrate. The wiring substrate has two contact terminals in electrical contact with each other. The semiconductor device has two contact terminals in electrical contact with each other and two detection-utility terminals respectively in electrical contact with the contact terminals of the semiconductor device. The contact terminals of the wiring substrate are located at positions so that they come in electrical contact with the corresponding contacts of the semiconductor device.

9 Claims, 6 Drawing Sheets

FIG.1

MOUNTING POSITION

FIG.3A
TOP SURFACE OF DEVICE

FIG.3B
REAR SURFACE OF DEVICE

| | STATE OF CONDUCTIVITY | | | | |
|---|---|---|---|---|---|
| FIRST DETECTION CIRCUIT | OFF | ON | | | OFF |
| SECOND DETECTION CIRCUIT | OFF | | ON | OFF | |
| POSITIONING | INADEQUATE | ADEQUATE | OPTIMUM | ADEQUATE | INADEQUATE |

SEMICONDUCTOR APPARATUS WITH MISALIGNMENT MOUNTING DETECTION

FIELD OF THE INVENTION

The present invention relates to a semiconductor apparatus comprising a semiconductor device mounted on a wiring substrate. Moreover, this invention relates to a method of and apparatus for mounting a semiconductor-device.

BACKGROUND OF THE INVENTION

When mounting a semiconductor device such as a flip chip or a BGA (Ball Grid Array) onto a wiring substrate, it is difficult to position the device against the wiring substrate while visually checking. The reason for this is that the functional electrode sections, such as bumps and conductor pads on the surface of the wiring substrate, which are to be connected to each other, are both hidden. If the semiconductor device is mounted on the wiring substrate in a misaligned position, the desired functioning cannot be expected from the semiconductor device and extensive repairs involving replacement will be required.

The following methods are known conventionally that try to solve the above problem. This is, a method wherein positioning slots (i.e., slots used when positioning is performed) or positioning projections (i.e., projections used when positioning is performed) are provided on the conductor pads of the wiring substrate, a method wherein the functional electrodes of the semiconductor device has special shapes, and a method wherein the misalignment is detected by placing a through-hole in the semiconductor device. However, these methods require separate manufacturing processes and different equipment for manufacturing the conductor pads plus the functional electrode section and for configuring the through-holes, causing the manufacturing costs to increase remarkably. Moreover, in the latter method, because the manufacturing process for making the through-holes differs from that for configuring the functional electrode sections of the semiconductor devices, misalignment of the through-holes and the functional electrode section is caused, with a possibility of decreasing the mounting accuracy of the semiconductor device.

Conventionally, there is also known a semiconductor device comprising misalignment-detection electrodes (i.e., electrodes used for detection of misalignment) near the functional electrode sections (see, for example, Japanese Laid Open Patent Application No. 10-335401). The misalignment of the misalignment-detection electrodes and the functional electrode sections is detected by determining whether there is electrical conductivity between the misalignment-detection electrodes and the conductor pads of the wiring substrate. In this method, there are advantages that the production cost does not increase or the mounting accuracy does not decrease due to misalignment of the functional electrodes and the misalignment-detection electrodes because the misalignment-detection electrodes can be configured with the same manufacturing process as that of the functional electrode section of the semiconductor device.

In the conventional art, when there is electrical conductivity between the misalignment-detection electrodes on the semiconductor device and the conductor pads on the wiring substrate, it is determined that there is misalignment in the semiconductor device and the wiring substrate. Conversely, when there is no electrical conductivity between the misalignment-detection electrodes on the semiconductor device and the conductor pads on the wiring substrate, it is determined that there is proper alignment between the semiconductor device and the wiring substrate. Obviously, misalignment cannot be detected when, for example, there is a loose connection between the misalignment-detection electrodes and the conductor pads. Moreover, a wrong detection determination that the semiconductor device and wiring substrate are positioned accurately can be made even when the connection is not loose, if, for example, the mounting position of the semiconductor device against the wiring substrate is misaligned greatly. As a result, even when there is misalignment in the semiconductor device and the wiring substrate, it cannot be corrected and repairs involving replacement will be required.

SUMMARY OF THE INVENTION

It is an object of this invention to provide a semiconductor apparatus, a method of and apparatus for mounting a semiconductor-device in which accurate and infallible detection as well as correction of misalignment in the semiconductor device and the wiring substrate can be made.

The semiconductor apparatus according to a one aspect of this invention comprises a wiring substrate and a semiconductor device to be mounted on the wiring substrate. Moreover, a pair of contact terminals provided in between the semiconductor device and the wiring substrate, which can come in electrical contact with each other. In addition, a pair of detection terminals on one of the semiconductor device and the wiring substrate in such a manner that they are spaced apart, or a pair of detection terminals placed separately on the semiconductor device and the wiring substrate. The contact terminal pairs are made to come in contact with each other when the semiconductor device is in line with the regular mounting position on the wiring substrate and there is an electrical conductivity between the detection terminals of the pair through these contact terminal pairs.

In the method of mounting a semiconductor-device on a wiring substrate according to another aspect of this invention, the semiconductor-device and the wiring substrate have a pair of contact terminals that come in electrical contact with each other when the semiconductor-device is mounted on a regular mounting position on the wiring substrate. The method comprises the step of positioning the semiconductor device on the wiring substrate according to the electrical conductivity between the pair of contact terminals due to a mutual contact between the pair of contact terminals.

In the apparatus for mounting a semiconductor-device on a wiring substrate according to still another aspect of this invention, the semiconductor-device and the wiring substrate have a pair of contact terminals that come in electrical contact with each other when the semiconductor-device is mounted on a regular mounting position on the wiring substrate. This apparatus comprises a determination unit which determines whether there is an electrical conductivity between the pair of contact terminals; a relative-position shifting-unit which alters the relative positions of the semiconductor-device and the wiring substrate; and a control unit which controls the relative-position shifting-unit to alter the relative positions of the semiconductor-device and the wiring substrate until the determination unit determine establishment of electrical conductivity between the pair of contact terminals.

Other objects and features of this invention will become apparent from the following description with reference to the accompanying drawings.

BRIEF DESCRIPTION OF THE DRAWINGS

FIG. 2A to FIG. 2D show the method of mounting the semiconductor device against the wiring substrate in the semiconductor apparatus shown in FIG. 1, and, in particular.

FIG. 3A to FIG. 3D show a configuration of a semiconductor apparatus according to a second embodiment of the present invention and, in particular.

DESCRIPTION OF THE PREFERRED EMBODIMENTS

Embodiments of a semiconductor apparatus, a method of and apparatus for mounting a semiconductor-device according to the present invention will be explained in detail while referring to accompanying drawings.

Figure 1:
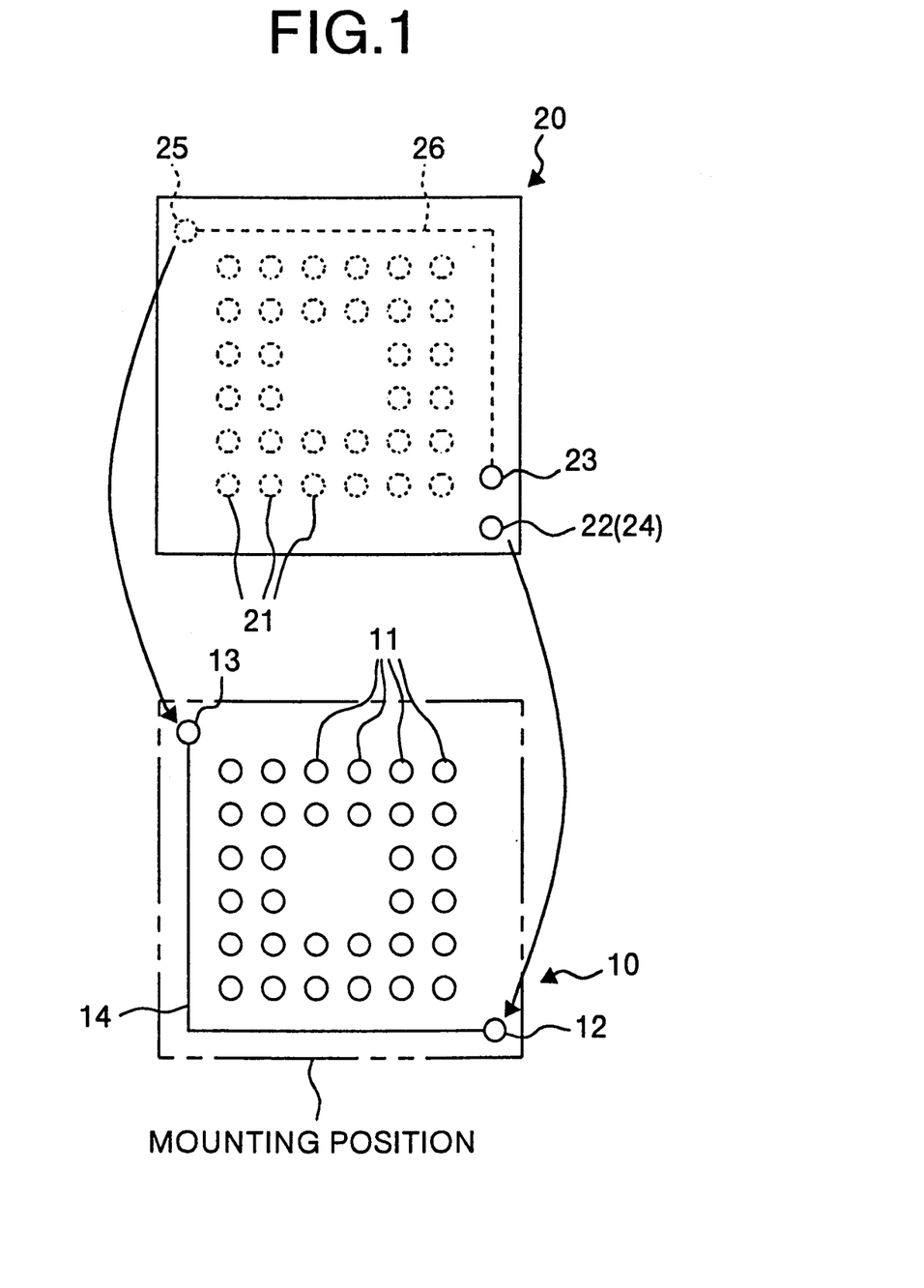
FIG. 1 shows a configuration of a semiconductor apparatus according to a first embodiment of the present invention, and in particular, the top part in this figure shows a conceptual diagram of the reverse side of a semiconductor device, and the bottom part shows a conceptual diagram of the top surface of a wiring substrate.
Figure 2A:
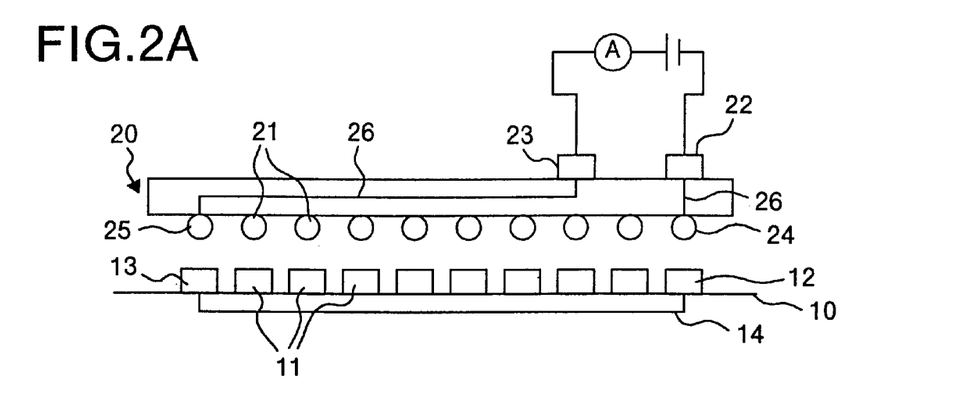
FIG. 2A shows a conceptual profile of a state just before mounting.
Figure 2B:
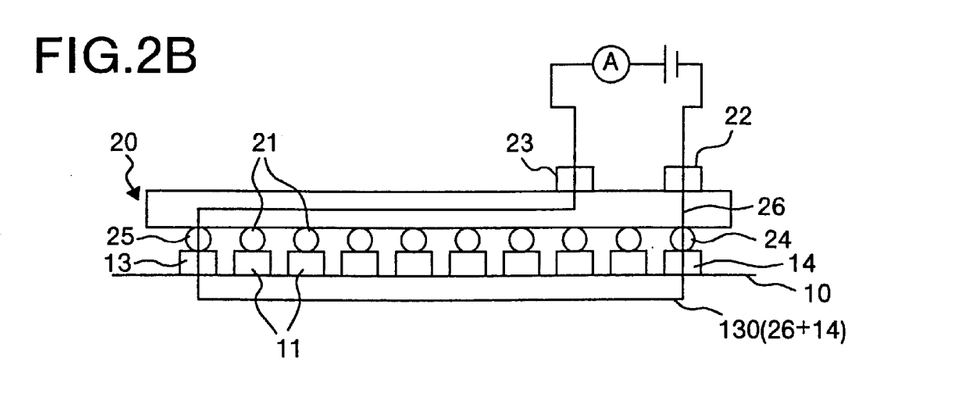
FIG. 2B shows a conceptual profile of a state of mounting in a regular mounting position.
Figure 2C:
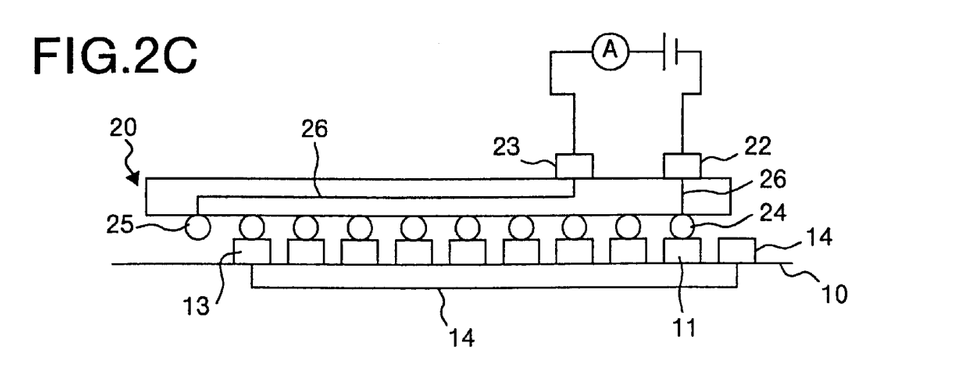
FIG. 2C shows a conceptual profile of a state in which misalignment is caused.

FIG. 1 shows a configuration of a semiconductor apparatus according to a first embodiment of the present invention. FIG. 2A to FIG. 2C show a mounting method of a semiconductor device against a wiring substrate in the semiconductor apparatus shown in FIG. 1. The semiconductor apparatus exemplified here is configured so that desired functions are provided, comprising a flip chip or BGA semiconductor device 20 mounted in a mounting position on the wiring substrate 10, and a functional electrodes 21 of the semiconductor device 20 electrically connected to respective conductor pads 11 of the wiring substrate 10. As shown in FIG. 1 and FIG. 2A, while the semiconductor device 20 comprises a pair of detection terminals 22 and 23 and device contact terminals 24 and 25, the wiring substrate 10 comprises substrate contact terminals 12 and 13.

The detection terminals 22 and 23 are spaced apart on the surface of the semiconductor device 20 and laid out protruded in positions parallel to each other. The device terminals 24 and 25 are laid out protruded in positions surrounding the functional electrodes 21 on the reverse side of the semiconductor device 20. In the first embodiment, the device terminals 24 and 25 are provided in two positions that lie on a diagonal line of the semiconductor device 20. Although the detection terminal 22 and the device terminal 24 are individually provided here, the configuration is not necessarily restricted to this example, that is, one of these terminals may be provided so that it perforates through the semiconductor device 20, wherein the perforated end will function as the other one of these terminals.

On the other hand, substrate contact terminals 12 and 13 are provided in the mounting position of the wiring substrate 10, protruded in positions surrounding the conductor pad 11. In the first embodiment, the substrate contact terminals 12 and 13 are provided in two positions where they are able to come in contact with the device terminals 24 and 25 of the semiconductor device 20 when the semiconductor device 20 is in line with the regular mounting position, that is, when the all the functional electrodes 21 match the corresponding conductor pads 11 on the wiring substrate 10.

In the semiconductor apparatus, the semiconductor device 20 and the wiring substrate 10 comprise detection wirings 26 and 14 respectively. These detection wirings 26 and 14 are configured in the semiconductor device 20 and the wiring substrate 10, so that they constitute a detection circuit 130 (see FIG. 2B) wherein there is an electrical conductivity between the single pair of detection terminals 22 and 23 through the device contact terminals 24 and 25 and the substrate contact terminals 12 and 13 when the semiconductor device 20 is in line with the regular mounting position of the wiring substrate 10.

In the semiconductor apparatus configured as above, when the semiconductor device 20 is in line with the regular mounting position against the wiring substrate 10, there is an electrical conductivity between the single pair of detection terminals 22 and 23 on the semiconductor device 20 through device terminals 24 and 25, substrate contact terminals 12 and 13, and the detection wirings 26 and 14 which come in contact with each other. Thus, accurate positioning of the semiconductor device 20 and the wiring substrate 10 will be possible as shown in FIG. 2B, by performing a continuity test between the single pair of detection terminals 22 and 23, without performing any function tests on the semiconductor apparatus.

Moreover, it becomes electrically conductive between the pair of detection terminals 22 and 23 only when all the functional electrodes 21 and the corresponding conductor pads 11 on the wiring substrate 10 match each other. For example, when either of the device terminals 24 and 25, the substrate contact terminals 12 and 13 and the detection terminals 22 and 23 has a loose connection, or when the mounting position of the semiconductor device 20 against the wiring substrate 10 is misaligned greatly as shown in FIG. 2C, electricity is not able to conduct between the single pair of detection terminals 22 and 23. Therefore, in the above situations, a wrong detection, detecting that they are accurately positioned, will not be made and accurate and infallible detection of misalignment will be achieved.

The detection terminal 22 and 23 on the semiconductor device 20, the device terminals 24, 25 and the detection wiring 26 can all be manufactured by the same process as that of the functional electrodes 21 and its wiring. In addition, the substrate contact terminals 12 and 13 on the wiring substrate 10 and the detection wiring 14 can all be manufactured by the same process as that of the conductor pads 11 and its wiring. As a result, there is no possibility of problems of production costs nor problems such as decrease in mounting accuracy due to misalignment in the functional electrodes 21 and the device terminals 24 and 25 and misalignment in the conductor pad 11 and the substrate contact terminals 12 and 13.

Figure 2D:
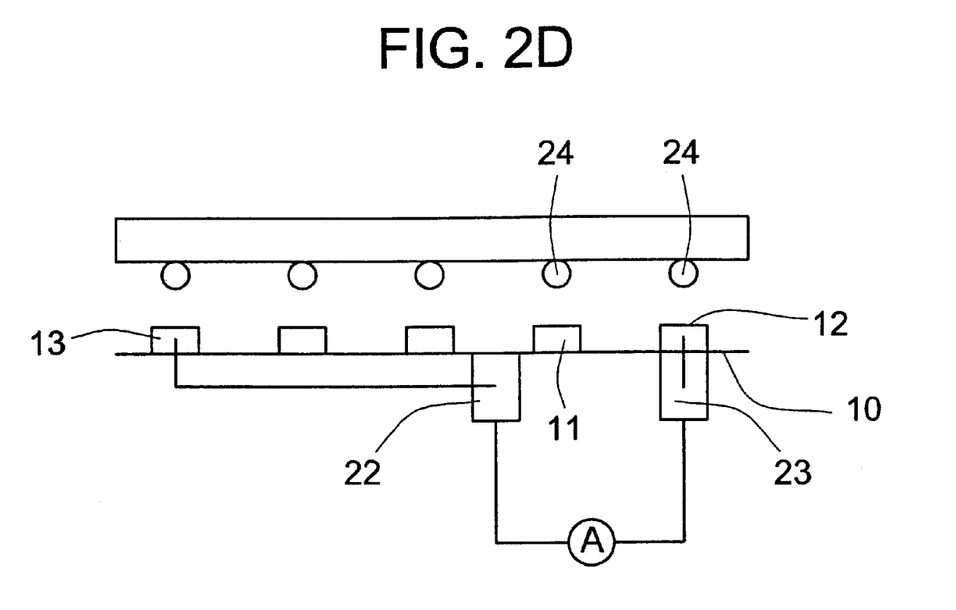
FIG. 2D shows an alternative to the arrangement of FIG. 2B.

In the first embodiment, although the single pair of detection terminals 22 and 23 are placed only on the semiconductor device 20, similar effects can be expected even when the single pair of detection terminals are provided only on the wiring substrate 10 as shown FIG. 2D, or are on each of the semiconductor device 20 and the wiring substrate 10.

A second embodiment of the present invention will now be explained. In the first embodiment, one detection circuit 130 is provided amongst the semiconductor device 20 and the wiring substrate 10. However, in the second embodiment, two detection circuits will be provided amongst a semiconductor device and a wiring substrate.

FIG. 3A to FIG. 3D are conceptual diagrams showing the configuration of a semiconductor apparatus according to the second embodiment of the present invention. The semiconductor apparatus exemplified here, like the first embodiment, comprises a flip chip or BGA semiconductor device 120 mounted in a mounting position on a wiring substrate 110 wherein desired functions are provided, comprising conductor pads 111 on the wiring substrate 110 which are electrically connected to functional electrodes 121 of the semiconductor device 120 respectively. While the semiconductor device 120 comprises detection terminal 122, 123, and 124, and device contact terminals 125, 126 and 127, the wiring substrate 110 comprises substrate contact terminals 112, 113 and 114.

Figure 3A:
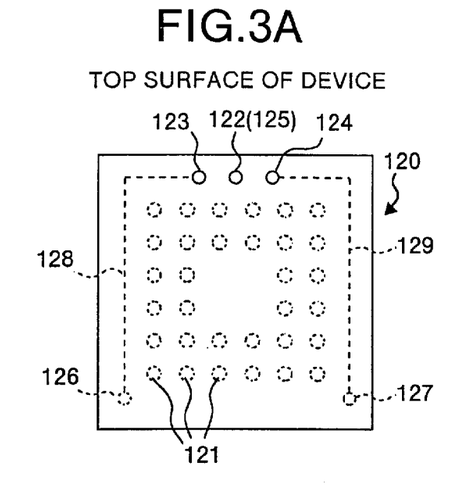
FIG. 3A shows a conceptual diagram of the surface of a semiconductor device.
Figure 3B:
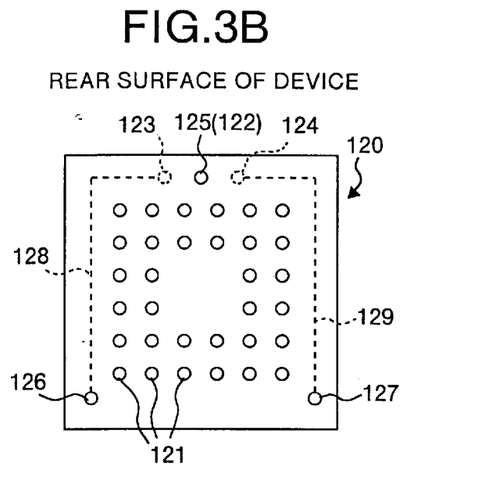
FIG. 3B shows a conceptual diagram of the reverse side of the semiconductor device.

The detection terminals 122, 123 and 124 are spaced apart on the surface of the semiconductor device 120, and are laid out protruded in positions parallel to each other. The device contact terminals 125, 126 and 127 are laid out protruded in positions surrounding the functional electrodes 121 on the reverse side of the semiconductor device 120. In the second embodiment, the device contact terminals 125, 126 and 127 are provided respectively in total of three positions, a position corresponding to the detection terminal 122 in the center and positions that are in the corners away from the detection terminal 122. Although the detection terminal 122 and the device terminals 125 are provided individually here, the configuration is not necessarily restricted to this example, that is, one of these terminals may be provided so that it perforates through the semiconductor device 120, wherein the perforated end will function as the other one of these terminals.

Figure 3C:
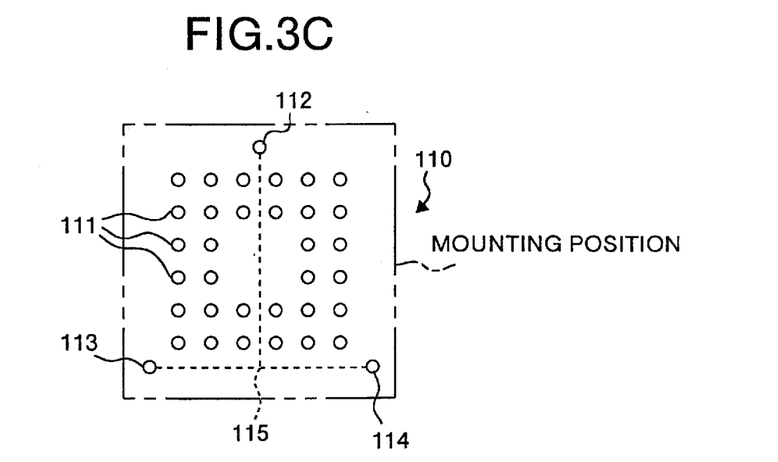
FIG. 3C shows a conceptual diagram of the top surface of a wiring substrate.

On the other hand, the substrate contact terminals 112, 113 and 114 are laid out protruded in positions surrounding the conductor pads 111 in the mounting position on the wiring substrate 110. In the second embodiment, the substrate contact terminals 112, 113 and 114 are provided in three positions where they are able to come in electrical contact with the device contact terminals 125, 126 and 127 on the semiconductor device 120 when the semiconductor device 120 is in line with the regular mounting position, that is, when all the functional electrodes 121 respectively matches the corresponding conductor pads 111 on the wiring substrate 110.

Figure 3D:
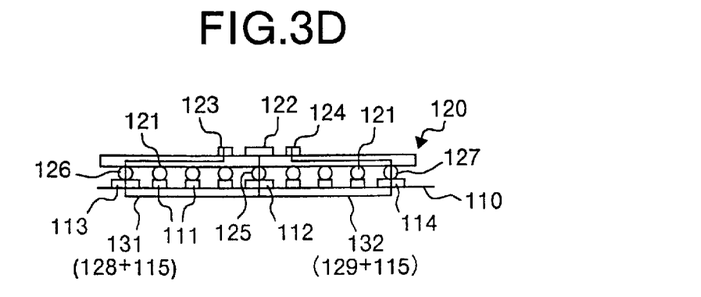
FIG. 3D shows a conceptual profile of a state of mounting in a regular mounting position.

In the semiconductor apparatus, the semiconductor device 120 and the wiring substrate 110 comprise detection wiring 128, 129 and 115 respectively. As shown in FIG. 3D, the detection wiring 128, 129, and 115 are configured on the semiconductor device 120 and the wiring substrate 110 so that the following detection circuits are provided when the semiconductor device 120 is in line with the regular mounting position of the wiring substrate 110. In the first detection circuit, there is an electrical conductivity between the detection terminal 122 in the center and the detection terminal 123 on one side of it through the two pairs of the device contact terminals 125 and 126 and the substrate contact terminals 112 and 113. In the second detection circuit 132, there is an electrical conductivity between the detection terminal 122 in the center and the detection terminal 124 on the other side of it through the two pairs of the device contact terminals 125 and 127 and the substrate contact terminals 112 and 114.

According to the semiconductor apparatus configured as above, there is an electrical conductivity between the detection terminals in pairs when the semiconductor device 120 is mounted in line with the regular mounting position against the wiring substrate 110. There is an electrical conductivity between the detection terminal 122 in the center of the semiconductor device 120 and the detection terminal 123 on one side of it through the device contact terminals 125 and 126, the substrate contact terminals 112 and 113 as well as the detection wirings 128 and 115 which are respectively in contact with each other. There is also an electrical conductivity between the detection terminal 122 in the center and the detection terminal 124 on the other side of it through the device contact terminals 125 and 127, the substrate contact terminals 112 and 114 as well as the detection wiring 129 and 115 which are respectively in contact with each other. Therefore, accurate positioning of the semiconductor device 120 and the wiring substrate 110 will be possible by performing a continuity test between the detection terminals 122 and 123 as well as 122 and 124, without performing any function tests on the semiconductor apparatus.

Figure 4:
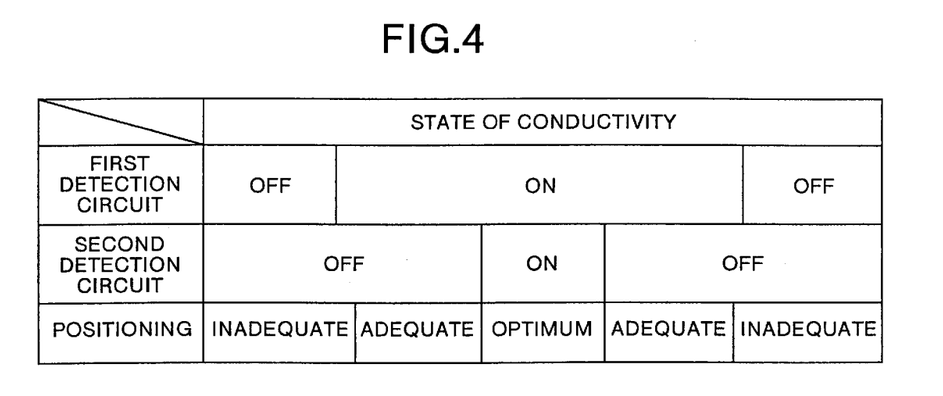
FIG. 4 is a table that shows the relationship between the state of a detection circuit and the mounting position.

In this case, the positioning can be done even more accurately than in the first embodiment because the electrical conductivity amongst the 2 detection terminal pairs, between the detection terminals 122 and 123 as well as 122 and 124, is tested. Moreover, multi-step positioning becomes possible when, for example, the sizes (outside diameters) of the device contact terminals 125, 126 and 127 as well as the substrate contact terminals 112, 113 and 114 are made smaller than the functional electrodes 121 and further, the sizes (outside diameters) of the device contact terminal 127 and the substrate contact terminals 114 which are placed in one corner are made smaller than the device contact terminal 125 and the substrate contact terminal 112 which are in position corresponding to the detection terminal 122 in the center, as well as the device contact terminal 126 and the substrate contact terminal 113 which are in the other corner. In other words, as shown in FIG. 4, an approximate positioning can be done according to the electrical conductivity between the detection terminal 122 in the center and the detection terminal 123 on one side of it, followed by a highly accurate positioning which can be done according to the electrical conductivity between the detection terminal 122 in the center and the detection terminal 124 on the other side of it.

Moreover, there is electrical conductivity between the detection terminals 122 and 123 as well as 122 and 124 respectively only when all the functional electrodes 121 match the corresponding conductor pads 111 on the wiring substrate 110. For example, when there is loose connection in any one of the device contact terminals 125, 126 and 127, the substrate contact terminals 112, 113 and 114, and the detection terminals 122, 123 and 124, or when the mounting position of the semiconductor device 120 against the wiring substrate 110 is misaligned greatly, there is no electrical conductivity between the detection terminals 122 and 123 as well as 122 and 124. Therefore, in the above situations, there is no possibility of a wrong detection, determining that they are accurately positioned, and thus accurate and infallible detection of misalignment in the semiconductor device 120 and the wiring substrate 110 will be achieved.

In addition, the detection terminals 122, 123 and 124 on the semiconductor device 120, the device contact terminals 125, 126 and 127 as well as the detection wirings 128, 129 and 115 can be all manufactured by the same process as that of the functional electrodes 121 and its wiring. The substrate contact terminals 112, 113 and 114 on the wiring substrate 110 and the detection wirings 128, 129 and 115 can be all made by the same manufacturing process as that of the conductor pad 111 and its wiring. As a result, there is no possibility of problems of production costs nor problems such as decrease in mounting accuracy due to misalignment in the functional electrodes 121 and the device contact terminals 125, 126 and 127 as well as misalignment in the conductor pad 111 and the substrate contact terminals 112, 113 and 114.

In the second embodiment, although the detection terminals 122, 123 and 124 are provided only on the semiconductor device 120, similar effects can be expected even when it is provided on the wiring substrate 110 instead, or on both the semiconductor device 120 as well as the wiring substrate 110.

Figure 5A:
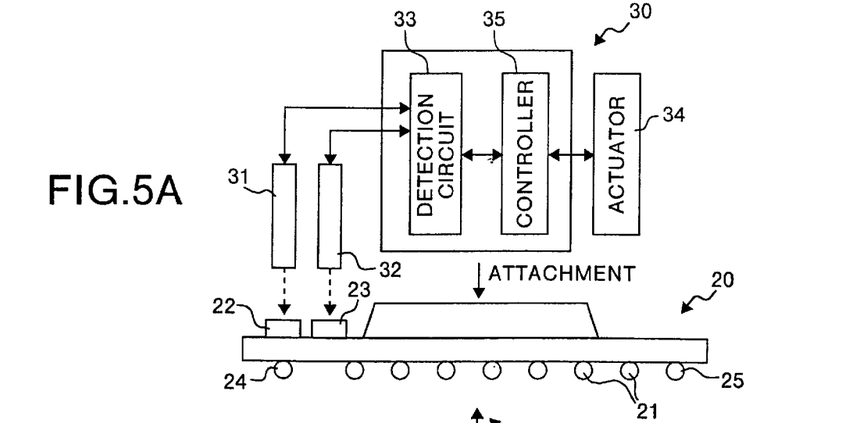
FIG. 5A shows a conceptual diagram of a configuration of a semiconductor-device mounting-apparatus 30 according to a third embodiment of the present invention.
Figure 5B:
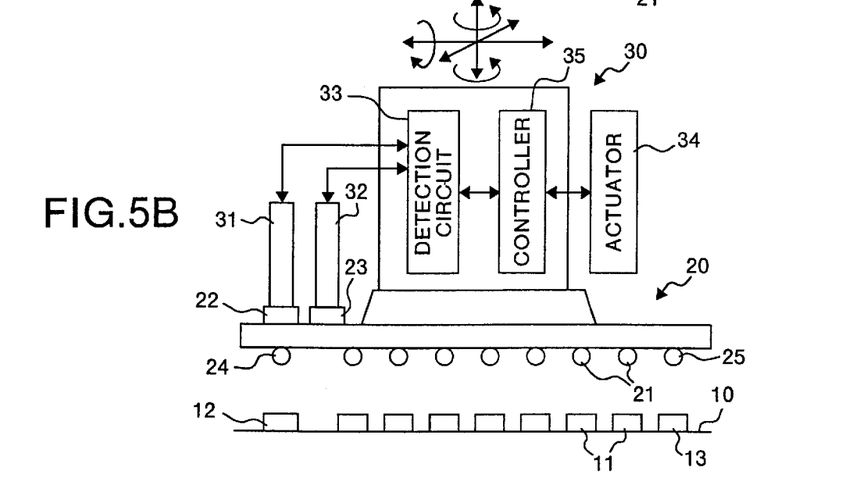
FIG. 5B shows a conceptual diagram of a state just before mounting.
Figure 5C:
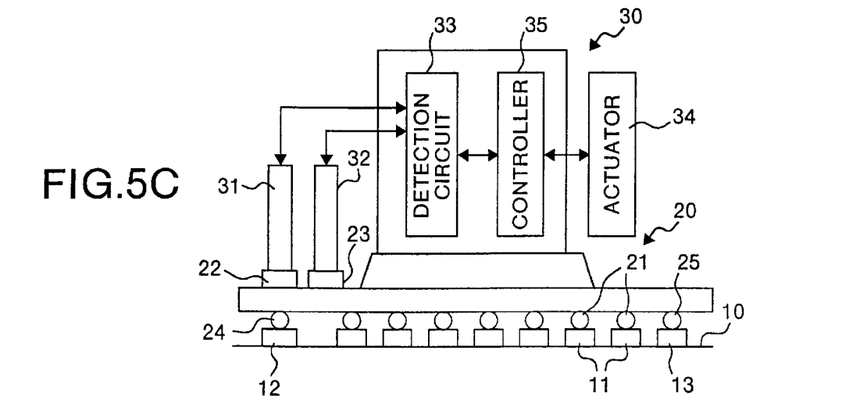
FIG. 5C shows a conceptual diagram of a state of mounting in a regular mounting position.

FIG. 5A to FIG. 5C show conceptually the configuration of a semiconductor-device mounting-apparatus according to a third embodiment of the present invention. The semiconductor-device mounting-apparatus 30 exemplified here is applicable to the semiconductor apparatuses according to the first and the second embodiments. The apparatus is used for mounting the semiconductor devices 20 and 120 in an attached state, into mounting positions of the wiring substrates 10 and 110. The following explanation will be made on its application to the semiconductor apparatus shown in the first embodiment.

As shown in FIG. 5A, when the semiconductor-device mounting-apparatus 30 comprises of detection probes 31 and 32, a determination circuit 33, an actuator 34 and a controller 35.

As shown in FIG. 5B, when detection probes 31 and 32 are attached to the semiconductor device 20, the probes come in electrical contact with detection terminals 22 and 23 on the semiconductor device 20. The determination circuit 33 determines through the detection probes 31 and 32 whether there is electrical conductivity between the detection terminals 22 and 23 on the semiconductor device 20. The actuator 34 shifts accordingly the relative position of the semiconductor device 20 in relation to the wiring substrate 10. The controller 35 controls the driving of the actuator 34, and shifts the position of the semiconductor device 20 in relation to the wiring substrate 10 so that the determination circuit 33 will determine that there is electrical conductivity.

As shown in FIG. 5C, according to the semiconductor-device mounting-apparatus 30 configured as above, the position of the semiconductor device 20 in relation to the wiring substrate 10 is altered so that there is always an electrical conductivity between the detection terminals 22 and 23, that is, so that the device contact terminals 24 and 25 on the semiconductor device 20 and the substrate contact terminals 12 and 13 on the wiring substrate 10 are respectively in contact with each other and all the functional electrodes 21 match the corresponding conductor pads 11 on the wiring substrate 10 respectively. In other words, when positions of the device contact terminals 24 and 25 and the substrate contact terminals 12 and 13 are misaligned from each other and the determination circuit 33 does not determine that there is an electrical conductivity between the detection terminals 22 and 23, the actuator 34 is driven according to the control signal from the controller 35 and the position of the semiconductor device 20 in relation to the wiring substrate 10 is altered so that the determination circuit will determine that determine that there is an electrical conductivity between detection terminals 22 and 23. Therefore, the misalignment in the mounting process of the semiconductor device 20 onto the wiring substrate 10 can be accurately and infallibly detected and corrected.

When the mounting apparatus is applied to the semiconductor apparatus of the second embodiment, three detection probes are to be provided.

As explained above, according to the present invention, electrical conductivity is established between the pair of detection terminals through the contact terminal pairs only when the semiconductor device and the wiring substrate are accurately positioned. Therefore, there is no possibility of a wrong detection, determining that they are accurately positioned, and accurate and infallible detection of misalignment of the semiconductor device and the wiring substrate will be achieved when, for example, there is loose connection in the contact terminals or the detection terminals, or when the mounting position of the semiconductor device against the wiring substrate is misaligned greatly. Further, because the contact terminal pairs and the detection terminals can be manufactured by the same process as that of the functional electrodes of the semiconductor device, there is no possibility of problems of manufacturing costs nor problems such as decrease in mounting accuracy due to misalignment in the functional electrode section and the contact terminal pairs.

Moreover, the positioning of the semiconductor device and the wiring substrate can be accurately done because electrical conductivity is established amongst the pair of detection terminals only when all the plural contact terminal pairs are in contact.

According to yet another aspect of the present invention, multi-step positioning becomes possible wherein an approximate positioning is done according to the electrical conductivity amongst one of the detection terminal pairs followed by a highly accurate positioning which is done according to the electrical conductivity amongst the other detection terminal pair. This is possible because electrical conductivity is established between the detection terminals in each pair plurally provided only when the positioning of the semiconductor device and the wiring substrate is made accurately.

According to yet another aspect of the present invention, there is no possibility of a wrong detection, determining that the semiconductor device and the wiring substrate are accurately positioned, even when, for example, there is a loose connection in the contact terminal pairs or the detection terminals, or when the semiconductor device is greatly misaligned from the mounting position in relation to the wiring substrate and thus accurate and infallible detection of the misalignment will be achieved as electrical conductivity is established according to the mutual contact between the contact terminal pairs only when the semiconductor device and the wiring substrate are accurately positioned.

According to still another aspect of the present invention, misalignment in the mounting process can be accurately and infallibly detected and corrected because the relative positions of the semiconductor device and the wiring substrate are altered to make it electrically conductive between the contact terminal pairs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor apparatus comprising:
    a semiconductor device having a wiring substrate on which said semiconductor device is mounted, said semiconductor device having opposed first and second surfaces;
    a first pair of contact terminals on said second surface of said semiconductor device and a second pair of contact terminals on said wiring substrate, said first and second pairs of contact terminals being positioned to come into electrical contact with each other; and
    a pair of spaced apart detection terminals on one of said first surface of said semiconductor device and said wiring substrate, wherein said first and second contact terminal pairs are in contact with each other when said semiconductor device is in a regular mounting position on said wiring substrate and an electrically conductive path is established between said detection terminals through said first and second pairs of contact terminals.

2. The semiconductor apparatus according to claim 1, including more than two pairs of said contact terminals, wherein a conductive path is established amongst said pair of detection terminals through said more than two pairs of contact terminals.

3. The semiconductor apparatus according to claim 1, including a more than two pairs of said contact terminals and a pair of detection terminals corresponding to each pair of said contact terminals.

4. A semiconductor apparatus comprising:
    a semiconductor device having a wiring substrate on which said semiconductor device is mounted, said semiconductor device having opposed first and second surfaces;
    a first pair of contact terminals on said second surface of said semiconductor device and a second pair of contact terminals on said wiring substrate, said first and second pairs of contact terminals being positioned to come into electrical contact with each other; and
    a pair of spaced apart detection terminals on said first surface of said semiconductor device, wherein said first and second contact terminal pairs are in contact with each other when said semiconductor device is in a regular mounting position on said wiring substrate and an electrically conductive path is established between said detection terminals through said first and second pairs of contact terminals.

5. The semiconductor apparatus according to claim 4, including more than two pairs of said contact terminals, wherein a conductive path is established amongst said pair of detection terminals through said more than two pairs of contact terminals.

6. The semiconductor apparatus according to claim 4, including a more than two pairs of said contact terminals and a pair of detection terminals corresponding to each pair of said contact terminals.

7. A semiconductor apparatus comprising:
    a semiconductor device having a wiring substrate on which said semiconductor device is mounted, said semiconductor device having opposed first and second surfaces;
    a first pair of contact terminals on said second surface of said semiconductor device and a second pair of contact terminals on said wiring substrate, said first and second pairs of contact terminals being positioned to come into electrical contact with each other; and
    a pair of spaced apart detection terminals on said wiring substrate, wherein said first and second contact terminal pairs are in contact with each other when said semiconductor device is in a regular mounting position on said wiring substrate and an electrically conductive path is established between said detection terminals through said first and second pairs of contact terminals.

8. The semiconductor apparatus according to claim 7, including more than two pairs of said contact terminals, wherein a conductive path is established amongst said pair of detection terminals through said more than two pairs of contact terminals.

9. The semiconductor apparatus according to claim 7, including a more than two pairs of said contact terminals and a pair of detection terminals corresponding to each pair of said contact terminals.

* * * * *